(12) United States Patent
Jung et al.

(10) Patent No.: US 11,615,837 B2
(45) Date of Patent: Mar. 28, 2023

(54) PSEUDO-TRIPLE-PORT SRAM DATAPATHS

(71) Applicant: QUALCOMM Incorporated, San Diego, CA (US)

(72) Inventors: Changho Jung, San Diego, CA (US); Arun Babu Pallerla, San Diego, CA (US); Chulmin Jung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 83 days.

(21) Appl. No.: 17/028,965

(22) Filed: Sep. 22, 2020

(65) Prior Publication Data

US 2022/0093171 A1 Mar. 24, 2022

(51) Int. Cl.
*G11C 11/419* (2006.01)
*G11C 11/413* (2006.01)
*H03K 19/20* (2006.01)

(52) U.S. Cl.
CPC .......... *G11C 11/419* (2013.01); *G11C 11/413* (2013.01); *H03K 19/20* (2013.01)

(58) Field of Classification Search
CPC ... G11C 11/413; G11C 11/417; G11C 11/419; G11C 8/16; G11C 7/12; G11C 7/18
USPC ........................................................ 365/154
See application file for complete search history.

(56) References Cited

U.S. PATENT DOCUMENTS

| | | | |
|---|---|---|---|
| 5,774,410 A | 6/1998 | Nakase | |
| 6,188,596 B1 * | 2/2001 | Holst | G11C 7/18 365/230.03 |
| 9,019,752 B1 | 4/2015 | Puckett et al. | |
| 9,208,859 B1 | 12/2015 | Bringivijayaraghavan et al. | |
| 9,824,749 B1 * | 11/2017 | Nautiyal | G11C 11/413 |
| 2015/0131368 A1 * | 5/2015 | Adams | G06F 30/36 716/110 |
| 2016/0358646 A1 | 12/2016 | Liaw | |
| 2017/0103817 A1 * | 4/2017 | Drake | G11C 11/418 |
| 2019/0287582 A1 | 9/2019 | Xu et al. | |
| 2019/0295656 A1 | 9/2019 | Clinton et al. | |
| 2020/0020361 A1 * | 1/2020 | Jain | G11C 11/417 |
| 2022/0036942 A1 * | 2/2022 | Wang | G11C 11/419 |

OTHER PUBLICATIONS

International Search Report and Written Opinion—PCT/US2021/051141—ISA/EPO—dated Dec. 22, 2021.

\* cited by examiner

*Primary Examiner* — Sung Il Cho
(74) *Attorney, Agent, or Firm* — QUALCOMM Incorporated

(57) ABSTRACT

A pseudo-triple-port memory is provided with read datapaths and write datapaths. The pseudo-triple-port memory includes a plurality of pseudo-triple-port bitcells, each pseudo-triple-port first bitcell having a first read port coupled to a first bit line, a second read port coupled to a second bit line, and a write port coupled to the first bit line and to the second bit line.

17 Claims, 8 Drawing Sheets

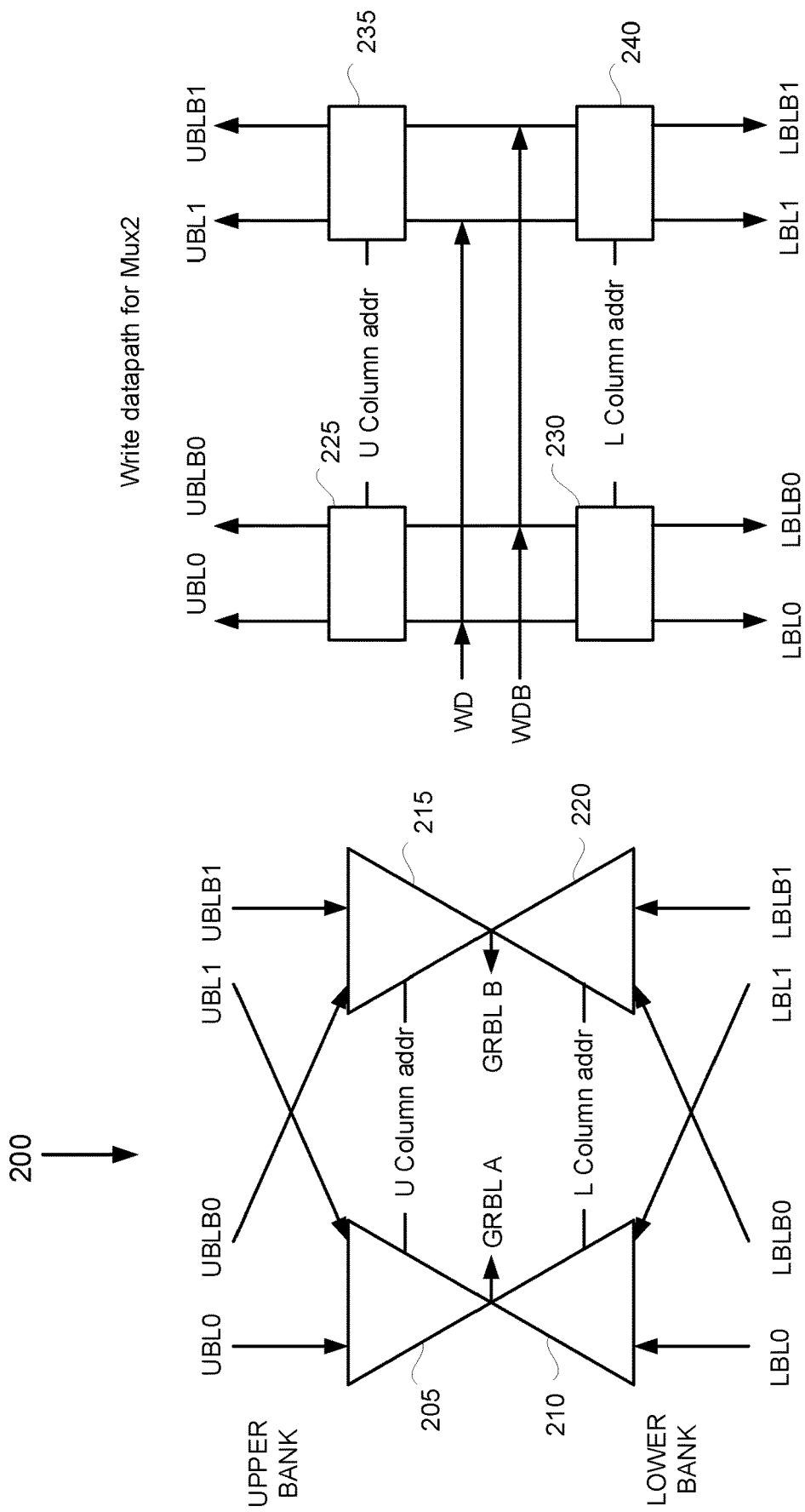

PSEUDO-TRIPLE-PORT SRAM DATAPATHS

TECHNICAL FIELD

This application relates to memories, and more particularly to a pseudo-triple-port SRAM.

BACKGROUND

In a conventional static random-access memory (SRAM), a bitcell connects to a pair of bit lines through a corresponding pair of access transistors during a read operation. To switch on the access transistors during a read operation, a word line controller asserts the voltage of a word line that connects to a gate of each of the access transistors. The controller also asserts the word line to switch on the access transistors during a write operation. The pair of access transistors and corresponding bit lines may thus be treated as a single read port and a single write port to the bitcells. The pair of bit lines are shared by other bitcells and their corresponding access transistors. The resulting group of bitcells linked by their common bit line pair is typically denoted as a column of bitcells. Since there is just one bit line pair for the column, only a single read operation or a single write operation can occur each time the word line is asserted.

To accommodate applications such as video processing that require simultaneous multiple read or write operations to the same column, dual-port SRAMs have been developed. In a dual-port SRAM, each column has two pairs of bit lines. Each bitcell may thus have one pair of access transistors for coupling to one of the bit line pairs and have another pair of access transistors for coupling to another one of the bit line pairs. Although such dual-port SRAMs enable simultaneous read/write operations, the extra access transistors for each bitcell lower density.

Accordingly, there is a need in the art for multi-port memories having increased density.

SUMMARY

In accordance with a first aspect of the disclosure, a memory is provided that includes: a first bit line for a first column; second bit line for the first column; the first column including a plurality of first bitcells, each first bitcell having a first read port coupled to the first bit line, a second read port coupled to the second bit line, and a write port coupled to the first bit line and to the second bit line; a first global read bit line; a second global read bit line; a first logic gate having a first input coupled to the first bit line and having an output coupled to the first global read bit line; and a second logic gate having a first input connected to the second bit line and having an output coupled to the second global bit line.

In accordance with a second aspect of the disclosure, a memory is provided that includes: a first bit line for a first column; a second bit line for the first column; the first column including a plurality of first bitcells, each first bitcell having a first read port coupled to the first bit line, a second read port coupled to the second bit line, and a write port coupled to the first bit line and to the second bit line; a first transmission gate having an output connected to the first bit line and an input for receiving a write data bit; and a second transmission gate having an output connected to the second bit line and an input for receiving a complement of the write data bit.

In accordance with a third aspect of the disclosure, a method for a pseudo-triple-port memory is provided that includes: in a read cycle responsive to a beginning of a cycle memory clock signal, performing a first single-ended read through a first bit line to a first bitcell in a column to charge the first bit line to a power supply voltage; while performing the first single-ended read, performing a second single-ended read through a second bit line to a second bitcell in the column to discharge the second bit line; and in a write cycle following the read cycle, writing to the first bitcell through the first bit line and through the second bit line, wherein the first bit line remains charged to the power supply voltage from an end of the read cycle to an end of the write cycle and the second bit line remains discharged from the end of the read cycle to the end of the write cycle.

These and additional advantages may be better appreciated through the following detailed description.

BRIEF DESCRIPTION OF THE DRAWINGS

FIG. 2A is a high-level diagram of the read datapaths for a MUX2 array of pseudo-triple-port SRAM bitcells in accordance with an aspect of the disclosure.

FIG. 2B is a high-level diagram of the write datapaths for a MUX2 array of pseudo-triple-port SRAM bitcells in accordance with an aspect of the disclosure.

Embodiments of the present disclosure and their advantages are best understood by referring to the detailed description that follows. It should be appreciated that like reference numerals are used to identify like elements illustrated in one or more of the figures.

DETAILED DESCRIPTION

To solve the density problems of dual-port memories, an SRAM bitcell is provided with two independent word lines. A first word line drives the gate of a first access transistor for the bitcell. Similarly, a second word line drives the gate of a second access transistor for the bitcell. The first access transistor couples between a true output node for the bitcell and a bit line. Similarly, the second access transistor couples between a complement output node for the bitcell and a complement bit line.

Figure 1:
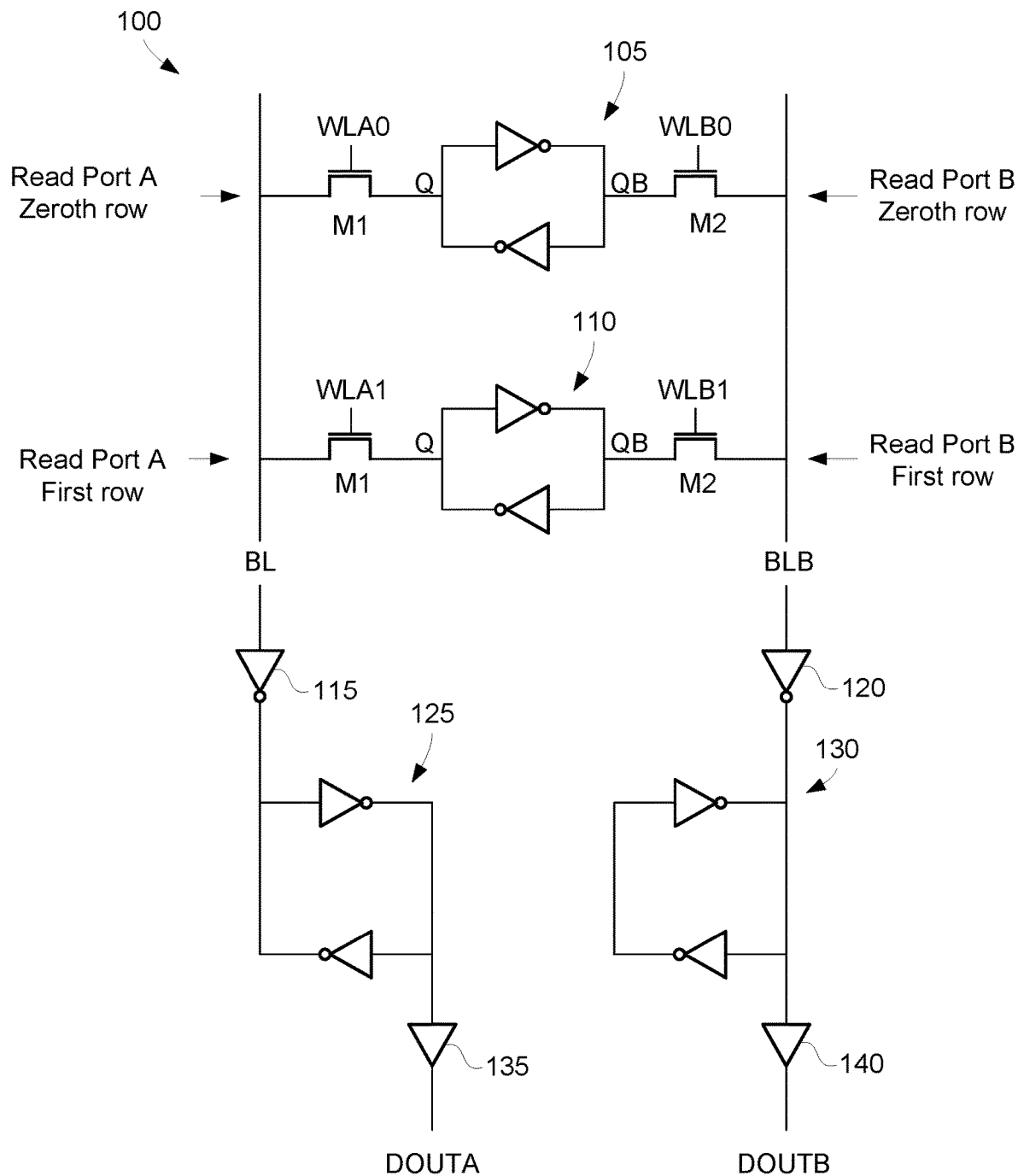
FIG. 1 illustrates a column of pseudo-triple-port SRAM bitcells in accordance with an aspect of the disclosure.

A read operation for the bitcell is single-ended since it involves just one of the bit lines. A plurality of the bitcells are arranged into a column and share the bit line and the complement bit line. Each bitcell has its own first access transistor and second access transistor controlled by a corresponding pair of word lines. An example column 100 of bitcells is shown in FIG. 1. Column 100 includes a first bitcell 105 and a second bitcell 110 but it will be appreciated that column 100 includes additional bitcells that are not shown for illustration clarity. Each bitcell is within its own row of other bitcells (not illustrated) as defined by a corresponding pair of word lines. For example, bitcell 105 is arranged in a zeroth row of bitcells. Similarly, bitcell 110 is in a first row of bitcells.

A read port A word line WLA0 extends across the zeroth row and drives a first n-type metal-oxide semiconductor (NMOS) access transistor M1 in bitcell 105. The read port A word line WLA0 similarly drives other first access transistors in the remaining bitcells (not illustrated) in the zeroth row. A read port B word line WLB0 also extends across the zeroth row and drives a second NMOS access transistor M2 in bitcell 105. The read port B word line WLB0 similarly drives other second access transistors (not illustrated in the zeroth row). Since the word lines are controlled independently during a read operation, the combination of the bit line, the read port A word line WLA0, and the access transistor M1 form a read port A for bitcell 105. The bit line BL may thus also be denoted as the read port A bit line. Similarly, the combination of the complement bit line, the read port B word line WLB0, and the access transistor M2 form a read port B for bitcell 105. The complement bit line BLB may thus also be denoted as a read port B complement bit line.

The word lines for the first row of bitcells are analogous. For example. a read port A word line WLA1 extends across the first row to drive access transistor M1 in bitcell 110. A read port B word line WLB1 extends across the first row to drive access transistor M2 in bitcell 110. Bitcell 110 thus has a read port A from a combination of its access transistor M1, the bit line BL, and the read port A word line WLA1. Similarly, bitcell 110 has a read port B from a combination of its access transistor M2, the complement bit line BLB and the read port B word line WLB1.

During a read operation to column 100, two different bitcells may be accessed simultaneously. For example, suppose that read port A is accessed in bitcell 105 through an assertion of a voltage for the word line WLA0. Since access transistor M1 couples between the true (Q) output node of bitcell 105, the voltage of bit line BL will be charged accordingly to the binary contents of bitcell 105 when the voltage of the read port A word line WLA0 is asserted. For example, suppose that the bit line BL was pre-charged to the power supply voltage for bitcell 105 and that bitcell 105 is storing a binary one in a binary-high convention. The output node Q of bitcell 105 will thus be charged to the power supply voltage. During the read operation to read port A, the bit line BL will thus remain charged to the power supply voltage. But if the bitcell 105 had been storing a binary zero, the read operation to read port A would cause the bit line BL to be discharged towards ground while the access transistor M1 is switched on.

With the read operation occurring to read port A for bitcell 105, no other bitcells such as bitcell 110 in column 100 can have a read access through their read port A as there would then be competition on bit line BL for the bit decision. But a simultaneous read operation may occur on read port B for another bitcell in column 100. For example, a read operation can occur through read port B in bitcell 110 while the read operation occurs through read port A in bitcell 105. During the read port B access, read port B word line WLB1 is asserted to switch on access transistor M2 for bitcell 110. Each access transistor M2 connects between the complement output node (QB) of its bitcell and the complement bit line BLB. Should bitcell 110 be storing a binary zero, the read access through read port B will cause bit line BLB to remain charged to the power supply voltage. Conversely, should bitcell 110 be storing a binary zero, the read access through read port B will cause bit line BLB to discharge while its access transistor M2 conducts. A read access through read port B will thus cause the complement bit line BLB to be charged according to the complement of the binary value stored in the accessed bitcell. Note that the same bitcell may be simultaneously accessed through its read port A and read port B although the bit decisions would of course be the same in that case.

Since an access through one of the read ports A and B does not use the voltage of the remaining read port's bit line, the resulting read operation is single-ended. An inverter and latch combination may thus be used as a latching sense amplifier for such single-ended bit decisions. It will be appreciated that column 100 is shown in simplified form in that bit line BL drives a global read bit line for read port A (global read bit line A) that is not shown for illustration clarity in FIG. 1 but will be discussed further herein. Similarly, bit line BLB drives a global read bit line for read port B (global read bit line B) that is also not shown in FIG. 1 but will be discussed further herein. It is the global read bit lines that drive the sense amplifiers. For example, an inverter 115 inverts a voltage of the global read bit line A to drive a latch 125 that latches a bit decision for the read-port-A-accessed bitcell such a bitcell 105. Similarly, an inverter 120 inverts a voltage of the global read bit line B to drive a latch 130 that latches a bit decision for the read-port-B-accessed bitcell such as bitcell 110. Since the stored bit in bitcell 105 is being inverted by inverter 115, latch 125 inverts the output of inverter 115 to provide a data output signal. In this case, since the read operation is to read port A, the resulting data output signal from latch 125 may be designated as DOUTA. A buffer 135 may buffer the DOUTA signal in some embodiments. Conversely, since read port B is driving the complement bit line BLB that is inverted by inverter 120, latch 130 is arranged so as to not invert the output of inverter 120. In this fashion, the output of latch 130 will equal the bit value (true or false) of the read-port-B-accessed bitcell such as bitcell 110. The resulting data output signal from read port B may be designated as DOUTB. A buffer 140 may buffer the DOUTB signal in some embodiments.

The resulting dual read ports A and B for the bitcells in column 100 are "pseudo read ports" since each bitcell has only two access transistors and the single pair of bit lines. In contrast, a bitcell with traditional dual read ports would have a pair of bit lines and a pair of access transistors for each port. Read ports A and B advantageously increase density as each bitcell may be formed from six transistors: the pair of access transistors M1 and M2 and four transistors to form the cross-coupled inverters within the bitcells.

The read operation occurs during a first portion of a memory clock signal cycle. A write operation may occur during a remaining second portion of the memory clock signal. The resulting read and write operation may thus be denoted as being "double pumped" in that both the read operation(s) and the write operation occur in one memory clock cycle. Although the word line pair for each row is controlled independently during a read operation, the word lines are not independently controlled during a write operation. To write into a bitcell, a write driver discussed further herein charges the bit line pair in a complementary fashion. For example, the write driver charges bit line BL to the power supply voltage and discharges the complement bit line BLB to ground to write a binary one to a bitcell in a row with the word line pair asserted. Conversely, the write driver charges the complement bit line BLB to the power supply voltage and discharges the bit line BL to ground to write a binary zero to such a bitcell. With the bit lines properly charged according to the write data bit, both the word lines to the bitcell are charged to the power supply voltage to turn on the bitcell's access transistors. For example, suppose that a write operation occurs to bitcell 105. After the write driver charges the bit line pair according to the write data bit, a word line controller asserts both the read access port A word line WLA0 and the read access port B word line WLB0 to write to bitcell 105. The combination of a word line pair, a bit line pair, and the pair of access transistors form a write port for a bitcell during a write operation. Bitcells such as bitcells 105 and 110 may thus be designated as pseudo-triple-port SRAM bitcells since each such bitcell may be accessed through its read port A, read port B, and write port. The following discussion will also refer to pseudo-triple-port SRAM bitcells as simply "bitcells" for brevity.

Although the write operation is differential to a pseudo-triple-port SRAM, the read operation is single-ended. As the number of rows is increased, the capacitance of the bit lines in a column will increase. With this increased capacitance, it will take longer and longer for an accessed bitcell to charge (or discharge) an accessed bit line to trigger a relatively simple single-ended sense amplifier such as inverters 115 and 120 to make a bit decision for the read operation. It is thus advantageous to divide an array of bitcells into banks. As defined herein, a bank refers to a subdivision of a column of bitcells such that the bitcells in a column portion assigned to one bank shares global read bit lines with the bitcells in the same column portion assigned to a neighboring bank. For example, suppose a column of bitcells is split into an upper bank column and a lower bank column. There is thus a global read bit line A (GRBLA) for read port A and a global read bit line B (GRBLB) for read port B that is shared by the upper bank column and the lower bank column. In some embodiments disclosed herein, multiple columns in each bank shares a pair of global read bit lines. In particular, suppose that two columns in each bank also share the pair of global read bit lines. The two columns in each bank are thus multiplexed onto the pair of global read bit line depending upon which column and bank is being accessed and depending upon which read port is being accessed. Since the resulting multiplexer selects between two columns, such memory embodiments are denoted herein as "MUX2." Note that the MUX2 multiplexer not only selects between the adjacent columns in one bank but also from the corresponding pair of columns in the neighboring bank. If, on the other hand, each column in a bank does not share its global read bit lines with a neighboring column in the bank, there is still the multiplexing between the same columns in the neighboring banks onto the shared pair of global read bit lines. Such memory embodiments are denoted herein as "MUX1."

The path from a bitcell through the accessed bit line to a corresponding global read bit line forms a read datapath. There are thus read datapaths for MUX1 arrays and read datapaths for MUX2 arrays. Similarly, there is a write datapath from the write driver through an accessed pair of bit lines to a bitcell. The write datapaths may be the substantially the same regardless of whether an array is MUX1 or MUX2.

The read and write datapaths for MUX2 arrays will now be discussed in more detail. Some example read datapaths for a MUX2 array 200 are shown in FIG. 2A. MUX2 array 200 is divided into an upper bank and a lower bank. Each bit line for the upper bank may thus be designated as an upper bit line whereas each bit line for the lower bank may be designated as a lower bit line. For illustration clarity, just two columns are shown for the upper and lower banks: a zeroth column and a first column. The bit lines for the zeroth column in the upper bank are designated as an upper bit line 0 (UBL0) and an upper complement bit line 0 (UBLB0). The bit lines for the first column in the upper bank are designated as an upper bit line 1 (UBL1) and an upper complement bit line 1 (UBLB1). Similarly, the bit lines for the zeroth column in the lower bank are designated as a lower bit line 0 (LBL0) and a lower complement bit line 0 (LBLB0). Finally, the bit lines for the first column in the lower bank are designated as a lower bit line 1 (LBL1) and a lower complement bit line 0 (LBLB1).

Recall that the bit line BL in column 100 of FIG. 1 forms part of the read port A for each of its bitcells whereas the complement bit line in column 100 forms part of the read port B for each of its bitcells. Referring again to FIG. 2A, bit lines UBL0 and LBL0 are thus part of the read port A for their corresponding bitcells. Similarly, bit lines UBL1 and LBL1 are part of the read port A for their corresponding bitcells. All of these "read port A associated" bit lines can drive a global read bit line A (GRBLA) depending upon which bank/column is being addressed for a read port A access. For example, a multiplexer 205 selects between the UBL0 and UBL1 bit lines based upon an upper column address (U column addr). If the upper column address is directed to read port A in the zeroth column, multiplexer 205 selects for the UBL0 bit line to drive the global read bit line A. Conversely, if the upper column address is directed to read port A in the first column, multiplexer 205 selects for the UBL1 bit line to drive the global read bit line A.

A multiplexer 210 is analogous to multiplexer 205 in that multiplexer 210 selects between the lower bank's read-port-A-associated bit lines in the zeroth and first columns when these columns are being addressed as determined by a lower column address (L Column addr). If the lower column address is directed to read port A in the zeroth column, multiplexer 210 selects for the LBL0 bit line to drive the global read bit line A. Conversely, if the lower column address is directed to read port A in the first column, multiplexer 210 selects for the LBL1 bit line to drive the global read bit line A.

The bit line selection for a global read bit line B (GRBLB) is analogous. For example, a multiplexer 215 selects between the UBLB0 and UBLB1 bit lines based upon the upper column address (U column addr). If the upper column address is directed to read port B in the zeroth column, multiplexer 215 selects for the UBLB0 bit line to drive the global read bit line B. Conversely, if the upper column address is directed to read port B in the first column, multiplexer 215 selects for the UBLB1 bit line to drive the global read bit line B.

A multiplexer 220 is analogous to multiplexer 215 in that multiplexer 220 selects between the read-port-B-associated bit lines in the zeroth and first columns when these columns in the lower bank are being addressed as determined by the lower column address. If the lower column address is directed to read port B in the zeroth column, multiplexer 220 selects for the LBLB0 bit line to drive the global read bit line B. Conversely, if the lower column address is directed to read port B in the first column, multiplexer 220 selects for the LBLB1 bit line to drive the global read bit line B.

The write datapaths for a MUX2 array are shown in FIG. 2B. A write data bit (WD) and the complement write data bit (WDB) are passed through a corresponding pass gate depending upon which bank and which column is being addressed in the write operation. The pass gates act as a column multiplexer to distribute the write data bit WD and the complement write data bit WDB to the addressed bank and column. For example, if the upper column address (U column addr) is addressed to the zeroth column in the upper bank, a pass gate 225 opens so that the write data bit WD drives the UBL0 bit line and so that the complement write data bit WDB drives the UBLB0 bit line. Conversely, if the upper column address is addressed to the first column in the upper bank, a pass gate 235 opens so that the write data bit WD drives the UBL1 bit line and so that the complement write data bit WDB drives the UBLB1 bit line.

The write datapaths to the lower bank are analogous. For example, if the lower column address (L: column addr) is addressed to the zeroth column in the lower bank, a pass gate 230 opens so that the write data bit WD drives the LBL0 bit line and so that the complement write data bit drives the LBLB0 bit line. Conversely, if the lower column address is addressed to the first column in the lower bank, a pass gate 240 opens so that the write data bit WD drives the LBL1 bit line and so that the complement write data bit WDB drives the LBLB1 bit line.

Figure 3A:
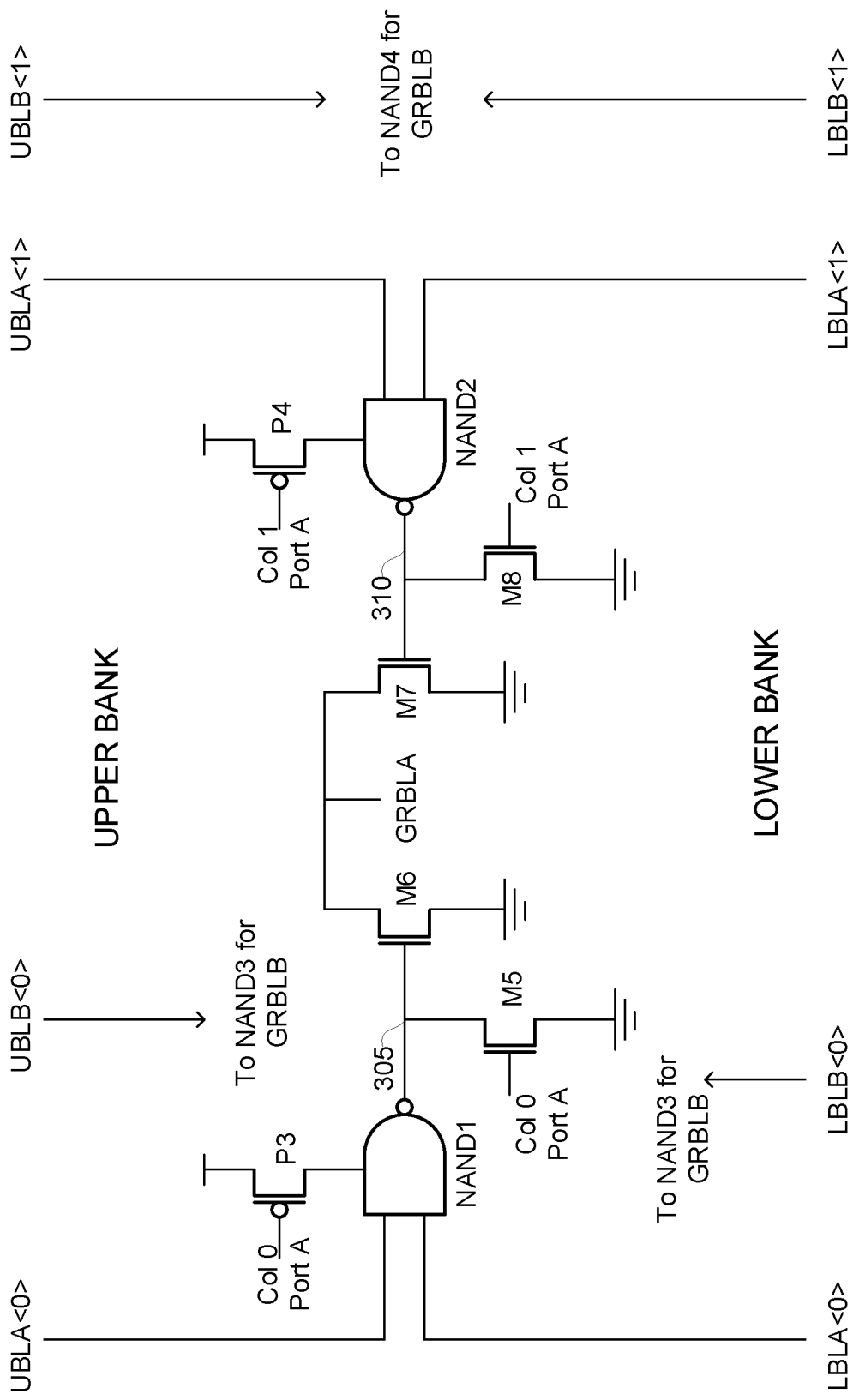
FIG. 3A is a circuit diagram for the read port A datapaths for a MUX2 array of pseudo-triple-port SRAM bitcells in accordance with an aspect of the disclosure.

The MUX2 datapaths for driving the global read bit line A (GRBLA) are shown in more detail in FIG. 3A. For illustration clarity, only the read port A datapaths are shown in FIG. 3A. Prior to a read operation, a pre-charge circuit (not illustrated) pre-charges the global read bit line A to the power supply voltage. A logic gate such as a first NAND logic gate (NAND1) receives the zeroth column read port A bit lines, UBLA<A> and LBLA<0>. The NAND1 logic gate is powered through a PMOS switch transistor P3 that is controlled by an active-low zeroth column read port A address (Col 0 Port A) that is asserted should a read operation be addressed to read port A for the zeroth column in the upper and lower banks. As defined herein, a signal is deemed to be "asserted" if that signal is logically true, regardless of whether that logic true state is represented by an active-high or an active-low convention. In an active-high convention, a signal is asserted by being charged to the power supply voltage. In an active-low convention, a signal is asserted by being discharged to ground.

If the Col 0 port A address signal is true, transistor P3 switches on. The source of transistor P3 connects to a node for the power supply voltage. The drain of transistor P3 connects to a power node for the NAND1 logic gate. The assertion of the Col 0 port A address signal thus powers on the NAND1 logic gate. If the Col 0 port A address signal is not asserted, the NAND1 logic gate is powered down and will thus float its output node 305. Output node 305 couples to ground through an NMOS transistor M5 having a source tied to ground and a drain connected to output node 305. The Col 0 port A address signal drives the gate of transistor M5. If the Col 0 port A address signal is false, transistor M5 is thus switched on to ground output node 305.

Output node 305 connects to a gate of an NMOS transistor M6 having a source connected to ground and a drain connected to the global read port A bit line (GRBLA). If the Col 0 port A address signal is false, output node 305 is grounded such that transistor M6 is off. The global read port A bit line would thus remain at its default pre-charged state. But suppose a read port A operation occurs on either of the UBLA<0> or the LBLA<0> bit lines that is accessing a binary zero value. Since the read operation is through one of these zeroth column read port A datapaths, the Col 0 port A address signal will be true so that the NAND1 logic gate is powered and so that transistor M5 is off. The resulting zero on one of the bit lines to the NAND1 logic gate causes the NAND1 logic gate to charge output node 305 to the power supply voltage. This charging of the output node 305 switches on transistor M6 to ground the global read bit line A. The global read bit line A voltage would thus be discharged to represent the zero that was read from whatever read port A datapath that was active in the zeroth column in the upper and lower banks.

Conversely, suppose that there was a read port A access to the zeroth column in the upper and lower banks in which the accessed bitcell was storing a binary one value. In that case, the bit lines UBLA<0> and LBLA<0> remain at their pre-charged state and are thus both charged to the power supply voltage. In response, the NAND1 logic gate grounds output node 305 so that transistor M6 remains off. The global read bit line A thus remains charged to the power supply voltage to properly represent the binary one value that was read from the accessed bitcell.

The read datapath for a read port A access to the first column in the upper and lower banks is analogous. For example, a NAND logic gate (NAND2) receives the upper bit line UBLA<1> and the lower bit line LBLA<1>. A PMOS transistor P4 couples between a power node for the NAND2 logic gate and the power supply node for the power supply voltage. An active-low Col 1 port A address signal that drives the gate of transistor P4 is asserted when read port B is accessed for the first column in the upper and lower banks. The NAND2 logic gate will thus be powered in response to the assertion of the active-low Col 1 port A address signal. Should the accessed-one of the bit lines UBLA<1> and LBLA<1> be discharged due to reading a binary zero from an accessed bitcell, an output node 310 of the NAND2 logic gate will be charged to the power supply voltage. Output node 310 connects to a gate of an NMOS transistor M7 having a source connected to ground and drain connected to the global read bit line B. Transistor M7 will thus be switched on to discharge the global read bit line B in response to the reading of a binary zero value through one of bit lines UBLA<1> and LBLA<1>.

Should the read operation on the accessed-one of the bit lines UBLA<1> and LBLA<1> be reading a binary one value, the NAND2 logic gate discharges its output node 310. Transistor M7 thus remains off so that the global read bit line B remains charged to the power supply voltage to represent the result of the binary-one read operation. Analogous to transistor M5, an NMOS transistor M8 has a source connected to ground and a drain connected to output node 310. The Col 1 port A address signal drives the gate of transistor M8. If the read port B is not active for the upper bank's first column and the lower bank's first column, the Col 1 port A address signal is false and thus switches on transistor M8 to ground the output node 310 and ensure that transistor M7 remains off Comparing the MUX2 read datapaths shown in FIG. 3A to those shown in FIG. 2A, it may be seen that the collection of the NAND1 logic gate, transistor P3, transistor M5, transistor M6, transistor M7, transistor M8, the NAND2 logic gate, and transistor P4 function as multiplexers 1105 and 1110 to select between the read port A bit lines to drive the global read bit line A.

Figure 3B:
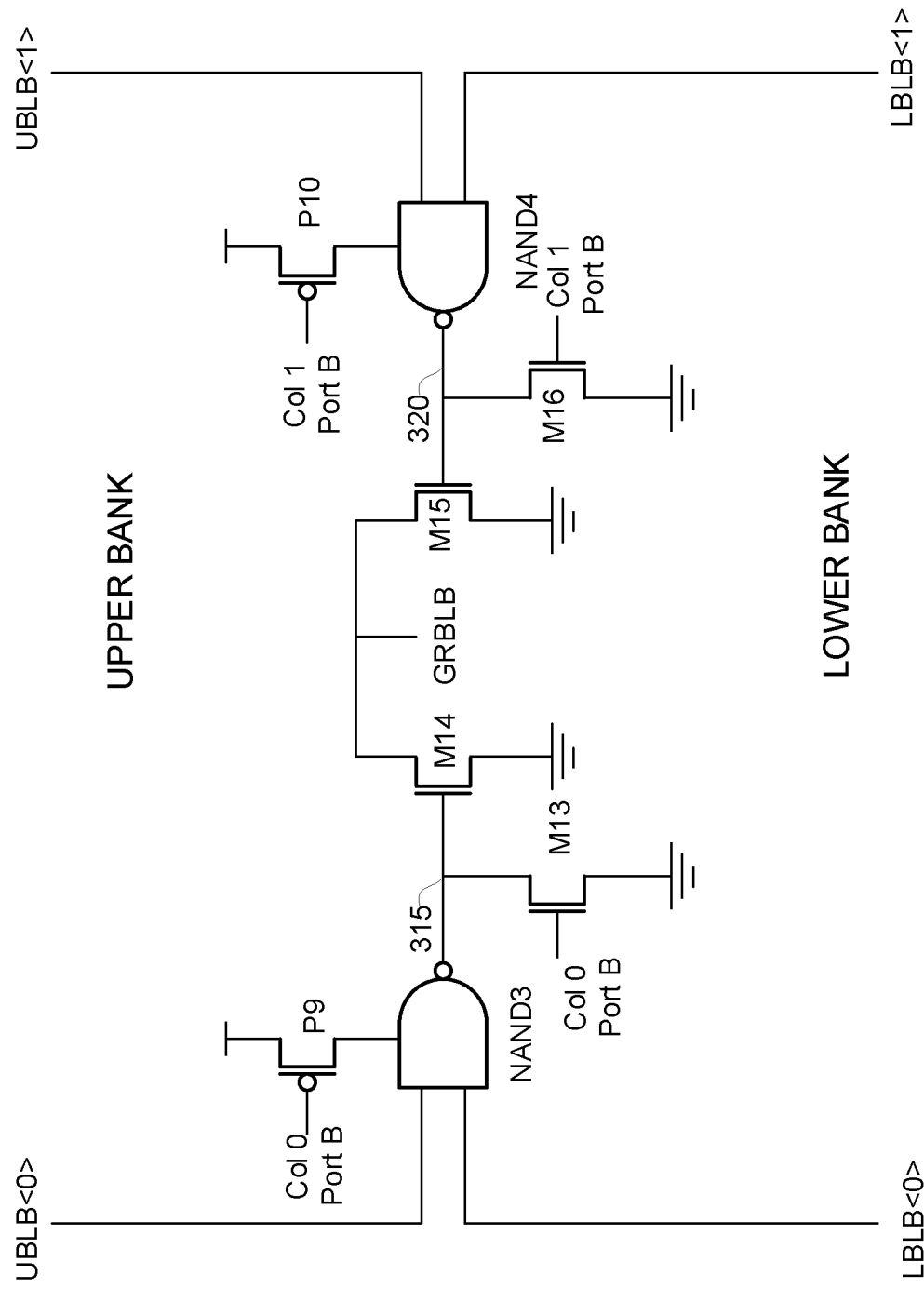
FIG. 3B is a circuit diagram for the read port B datapaths for a MUX2 array of pseudo-triple-port SRAM bitcells in accordance with an aspect of the disclosure.

The read port B datapaths are shown in FIG. 3B and are analogous to the read port A read datapaths. The read port A datapaths are not shown in FIG. 3B for illustration clarity. The zeroth column's read port B bit line for the upper bank (UBLB<0>) and the zeroth column's read port B bit line for the lower bank (LBLB<0>) may drive a NAND logic gate (NAND3) that is analogous to the NAND1 logic gate in that it is coupled to an analogue of transistor P3, transistor M5, and transistor M6 to drive the global read bit line B. In particular, the NAND3 logic gate is powered through a PMOS switch transistor P9 that is controlled by an active-low zeroth column read port B address (Col 0 Port B) that is asserted should a read operation be addressed to read port B for the zeroth column in the upper and lower banks.

If the Col 0 port B address signal is true, transistor P9 switches on. The source of transistor P9 connects to a node for the power supply voltage. The drain of transistor P9 connects to a power node for the NAND3 logic gate. The assertion of the Col 0 port B address signal thus powers on the NAND3 logic gate. If the Col 0 port B address signal is not asserted, the NAND3 logic gate is powered down and will thus float its output node 315. Output node 315 couples to ground through an NMOS transistor M13 having a source tied to ground and a drain connected to output node 315. The Col 0 port B address signal drives the gate of transistor M13. If the Col 0 port B address signal is false, transistor M13 is thus switched on to ground output node 315.

Output node 315 connects to a gate of an NMOS transistor M14 having a source connected to ground and a drain connected to the global read port B bit line (GRBLB). If the Col 0 port B address signal is false, output node 315 is grounded such that transistor M14 is off. The global read port B bit line would thus remain at its default pre-charged state. But suppose a read port B operation occurs on either of the UBLB<0> or the LBLB<0> bit lines that is accessing a binary zero value. Since the read operation is through one of these zeroth column read port B datapaths, the Col 0 port B address signal will be true so that the NAND3 logic gate is powered and so that transistor M13 is off. The resulting zero on one of the bit lines to the NAND3 logic gate causes the NAND3 logic gate to charge output node 315 to the power supply voltage. This charging of the output node 315 switches on transistor M14 to ground the global read bit line B. The global read bit line B voltage would thus be discharged to represent the zero that was read from whatever read port B datapath that was active in the zeroth column in the upper and lower banks.

Conversely, suppose that there was a read port B access to the zeroth column in the upper and lower banks in which the accessed bitcell was storing a binary one value. In that case, the bit lines UBLB<0> and LBLB<0> remain at their pre-charged state and are thus both charged to the power supply voltage. In response, the NAND3 logic gate grounds output node 315 so that transistor M14 remains off. The global read bit line B thus remains charged to the power supply voltage to properly represent the binary one value that was read from the accessed bitcell.

The read datapath for a read port B access to the first column in the upper and lower banks is analogous. For example, a NAND logic gate (NAND4) receives the upper bit line UBLB<1> and the lower bit line LBLB<1>. A PMOS transistor P10 couples between a power node for the NAND4 logic gate and the power supply node for the power supply voltage. An active-low Col 1 port B address signal that drives the gate of transistor P10 is asserted when the read port B is accessed for the first column in the upper and lower banks. The NAND4 logic gate will thus be powered in response to the assertion of the active-low Col 1 port B address signal. Should the accessed-one of the bit lines UBLB<1> and LBLB<1> be discharged due to reading a binary zero from an accessed bitcell, an output node 320 of the NAND4 logic gate will be charged to the power supply voltage. Output node 320 connects to a gate of an NMOS transistor M15 having a source connected to ground and drain connected to the global read bit line B. Transistor M15 will thus be switched on to discharge the global read bit line B in response to the reading of a binary zero value through one of bit lines UBLB<1> and LBLB<1>.

Should the read operation on the accessed-one of the bit lines UBLB<1> and LBLB<1> be reading a binary one value, the NAND4 logic gate discharges its output node 320. Transistor M15 thus remains off so that the global read bit line B remains charged to the power supply voltage to represent the result of the binary-one read operation. Analogous to transistor M5, an NMOS transistor M16 has a source connected to ground and a drain connected to output node 320. The Col 1 port B address signal drives the gate of transistor M16. If the read port B is not active for the upper bank's first column and the lower bank's first column, the Col 1 port B address signal is false and thus switches on transistor M16 to ground the output node 320 and ensure that transistor M15 remains off.

Figure 4:
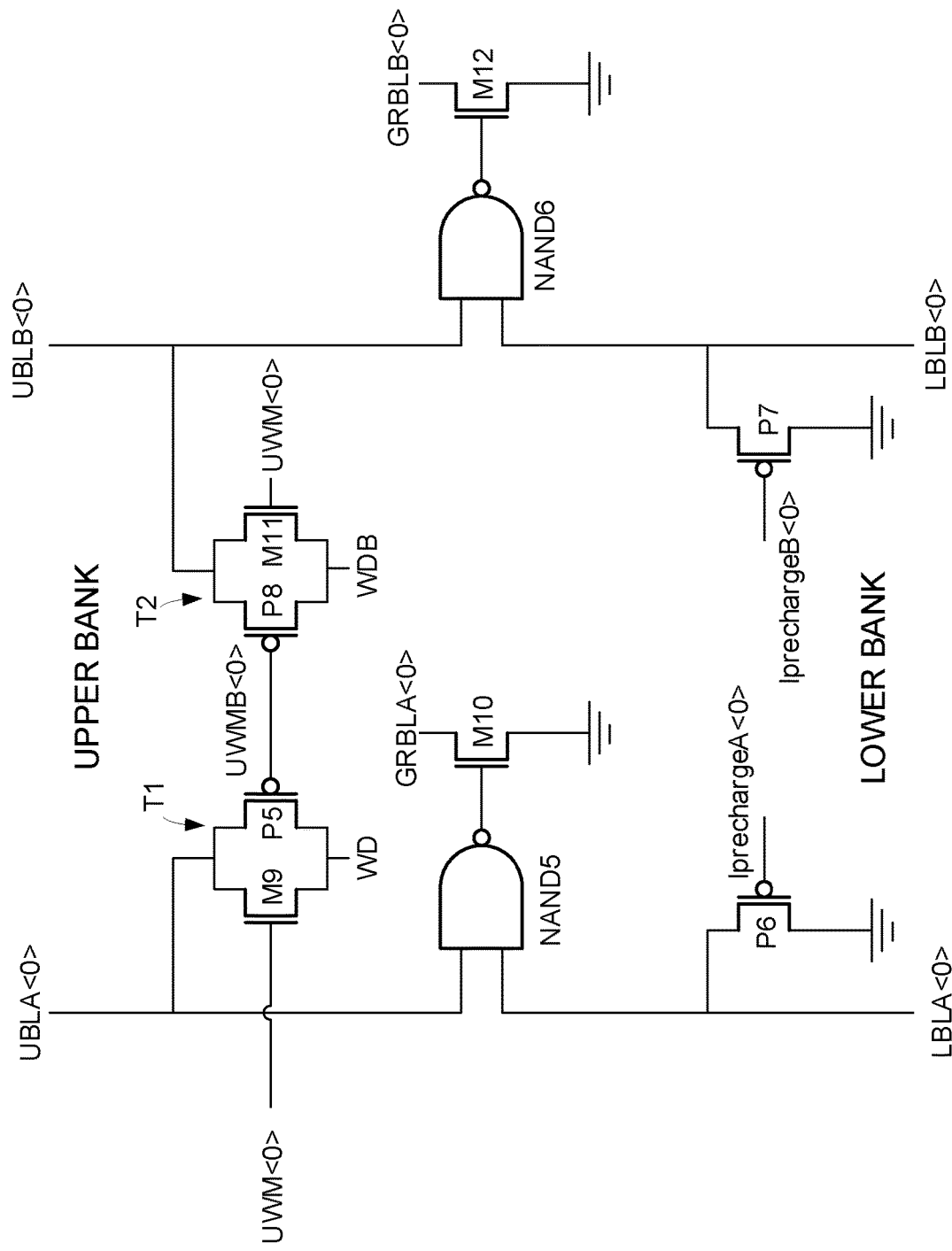
FIG. 4 is a circuit diagram for the read and write datapaths for a MUX1 array of pseudo-triple-port SRAM bitcells in accordance with an aspect of the disclosure.

The read datapaths for a MUX1 array having an upper bank and a lower bank is shown in FIG. 4. Since FIG. 4 is directed to a MUX1 array, only the zeroth columns for the upper and lower banks are shown as the read datapaths would be analogous for the remaining columns. The zeroth column in the upper bank includes a read port A bit line (UBLA<0> and a read port B bit line UBLB<0>). Similarly, the zeroth column in the lower bank includes a read port A bit line (LBLA<0>) and a read port B bit line (LBLB<0>). The read port A bit lines UBLA<0> and LBLA<0> drive a NAND logic gate (NAND5) that in turn drives a gate of an NMOS transistor M10 having a source connected to ground and a drain connected to the read port A global read bit line for the zeroth column (GRBLA<0>). Should the read port A access to the zeroth columns be reading a binary zero, the NAND5 logic gate switches on the M10 transistor to discharge the global read bit line A for the zeroth column. But if the read port A access is reading a binary one, transistor M10 is off so that the global read bit line A for the zeroth column remains charged to the power supply voltage to reflect the successful reading of a binary one value. An analogous NAND logic gate (NAND6) NANDs the read port B bit lines UBLB<0> and LBLB<0> to drive a gate of an NMOS transistor M12. Transistor M12 is analogous to transistor M10 and thus has a source connected to ground and a drain connected to the read port B global read bit line for the zeroth column (GRBLB<0>). The read port B access is thus analogous to the read port A access.

A write datapath for the MUX1 array is also shown in FIG. 4. The write datapath to the zeroth column in the upper bank occurs through a pair of transmission gates T1 and T2. Transmission gate T1 is formed by a parallel combination of an NMOS transistor M9 and a PMOS transistor P5. The write data bit WD drives transmission gate T1. Similarly, transmission gate T2 is formed by a parallel combination of an NMOS transistor M11 and a PMOS transistor P8. The complement write data bit WDB drives transmission gate T2. An upper bank write multiplexer signal for the zeroth column (UWM<0>) and its complement (UWMB<0>) control whether transmission gates T1 and T2 are open or closed. UWM<0> is an active high signal that is asserted when the write operation is directed to the upper bank's zeroth column. UWMB<0> is the complement of UWM<0>. UWM<0> drives the gates of transistors M9 and M11. Similarly, UWMB<0> drives the gates of transistors P5 and P8. Transmission gates T1 and T2 are thus closed (conducting) when UWM<0> is asserted so that the write bit signal WD controls the voltage of the UBLA<0> bit line and so that the complement write bit signal WDB controls the voltage of the UBLB<0> bit line. Conversely, if UWM<0> is de-asserted, transmission gates T1 and T2 are open (non-conducting).

The write datapaths to the lower bank's bit lines in the zeroth column as they may be formed by a pair of transmission gates that are analogous to transmission gates T1 and T2 and receive the same write data bit and its complement. A lower bank write multiplexing signal controls whether this lower bank pair of transmission gates is closed or open. Should the write operation be to the lower bank's zeroth column, the lower bank's pair of transmission gates would close so that the write data bit WD controls the voltage of the LBLA<0> bit line and so that the complement write data bit WDB controls the voltage of the LBLB<0> bit line.

Referring again to FIG. 2B, note that the MUX2 write datapaths may be analogous since the write access uses both bit lines in the accessed column. There would thus be a pair of transmission gates for each upper bank or lower bank column. For example pass gate 225 may be formed by two transmission gates, pass gate 230 may be formed by two transmission gates, and so on. Since there are two columns being multiplexed, a common write data bit WD and its complement WDB would drive the resulting four pairs of transmission gates. Depending upon which column is being written to, the column's pair of transmission gates would close so that the write operation may occur to the appropriate column.

Regardless of whether an array is a MUX1 or a MUX2 array, the bit lines may be pre-charged prior to a read operation. Since this pre-charging is independent of the MUX1/MUX2 implementation, the pre-charge transistors are only shown for the lower bank's zeroth column in FIG. 4. The read port A bit line LBLA<0> may be precharged by a PMOS transistor P6 having a source connected to the power supply node and a drain connected to the LBLA<0> bit line. An active-low precharge signal (IprechargeA<0>) drives the gate of transistor P6. During a pre-charge period prior to the read operation, the precharge signal IprechargeA<0> is asserted to switch on transistor P6 to charge the LBLA<0> bit line to the power supply voltage. Similarly, the read port B bit line LBLB<0> may be precharged by a PMOS transistor P7 having a source connected to the power supply node and a drain connected to the LBLB<0> bit line. An active-low precharge signal (IprechargeB<0>) drives the gate of transistor P7. During the pre-charge period prior to the read operation, the precharge signal IprechargeB<0> is asserted to switch on transistor P6 to charge the LBLB<0> bit line to the power supply voltage. It will be appreciated that the remaining columns in both a MUX1 and a MUX2 implementation may be pre-charged analogously using a pair of transistors such as discussed with regard to transistors P6 and P7.

Figure 5B:
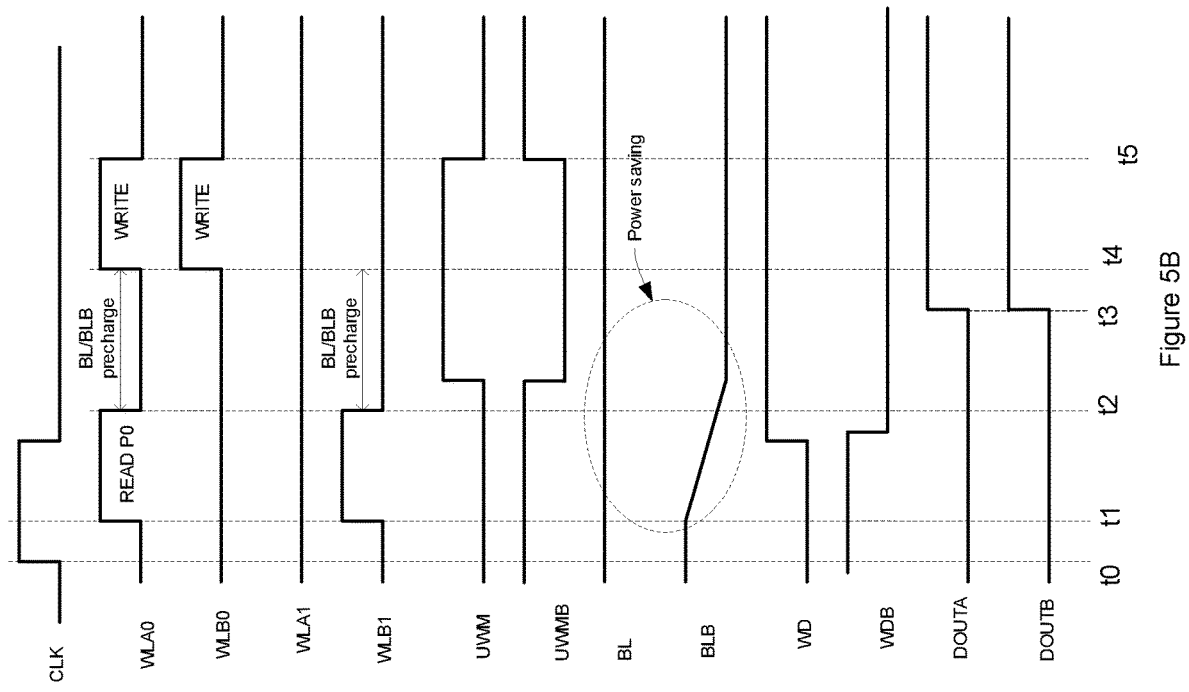
FIG. 5B illustrates some operating waveforms during a read and write cycle for a pseudo-triple-port memory having reduced power consumption during a pre-charge period prior to the write operation in accordance with an aspect of the disclosure.
Figure 5A:
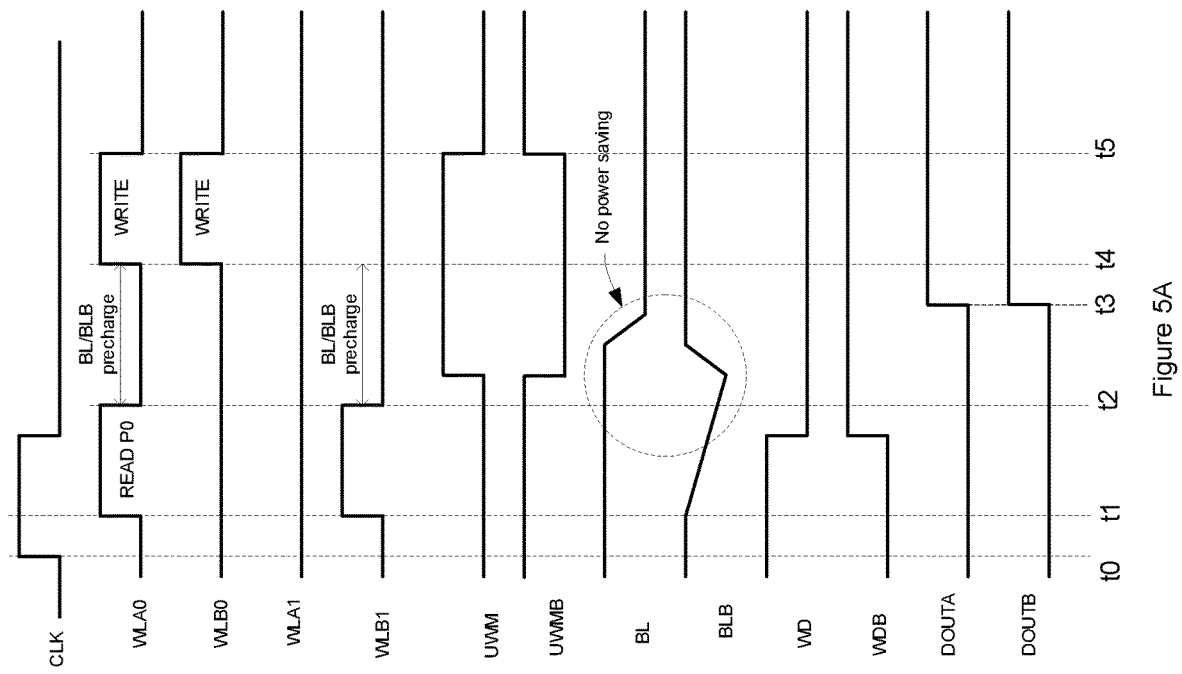
FIG. 5A illustrates some operating waveforms during a read and write cycle for a pseudo-triple-port memory in which power is consumed in the pre-charge period prior to the write operation in accordance with an aspect of the disclosure.

Some example operating waveforms for either a MUX1 or a MUX2 array are shown in FIG. 5A. The following discussion of FIG. 5A will also refer to column 100 of FIG. 1. A memory clock signal CLK is asserted at a time t0 to start a read cycle followed by a write cycle in one cycle of the memory clock signal CLK. From a time t1 to a time t2, the read port A word line WLA0 for the zeroth row is asserted. In this example, it is assumed that bitcell 105 is storing a binary one such that the Q output node of bitcell 105 is charged to the power supply voltage. Bit line BL thus remains charged to the power supply voltage at time t2. During the same word line assertion period from time t1 to time t2, the read port B word line WLB1 is asserted to perform a read port B access to bitcell 110. In this example, it is assumed that bitcell 110 is also storing a binary one such that its QB output node is discharged to ground. The complement bit line BLB is thus discharged at time t2. The DOUTA data output signal for read port A is thus a binary one at time t3. Similarly, the DOUTB data output signal for read port B is also a binary one at time t3 since bitcell 110 was storing a binary one value.

A write operation then occurs at a time t4 to bitcell 105. Prior to time t3, the column write multiplexing signal UWM is asserted so that its complement UWMB is de-asserted. The write bit signal WD is a binary zero so the complement write bit signal WDB is a binary one. Note that there is no separate pre-charge of the bit lines Bl and BLB for the write operation other than produced by the write driver. This contrasts with a conventional memory in which the bit line pairs are both pre-charged prior to the write operation. Since the write operation pre-charging is caused only by the write driver as passed through transmission gates T1 and T2 of FIG. 4, this results in a power savings if there is no binary change in the bit lines from the read operation to the write operation. In FIG. 5A, the write bit signal WD is the complement of the DOUTA data output signal from the read operation so that the line BL must be discharged from its charged state and the complement bit line BLB charged from its discharged state. There is thus no power savings that occur during the bit line pre-charging from time t2 to time t4. The write operation is double-ended (which may also be denoted as differential) as discussed previously so that both word lines WLA0 and WLB0 to bitcell 105 are asserted from time t4 to a time t5 during the write operation.

In contrast to the read and write operations of FIG. 5A, a power savings occurs during the pre-charging of the bit lines as shown in FIG. 5B. In this example, the clock signal CLK is again asserted at time t0 to begin the read and write cycles. Bitcell 105 and 110 are again assumed to be storing binary one values. A read port A access to bitcell 105 and a read port B access to bitcell 110 occurs from times t1 to times t2 as discussed regarding FIG. 5A. Thus, at time t2 in FIG. 5B, the bit line BL is charged to the power supply due to the binary one value stored in bitcell 105 whereas the complement bit line BLB is discharged due to the read of the binary one value stored in bitcell 110. The DOUTA and DOUTB data output signals thus both go high at time t3. But in FIG. 5B, the write data bit WD is a binary one prior to time t2 such that the complement write data bit WDB is a binary zero. The resulting write driving of the bit lines BL and BLB that occurs when the column write multiplexing signal UWM after time t2 is asserted is thus identical to the binary state of these bit lines that occurs after the read operation. The write driving of the bit lines in FIG. 5B between time t2 to time t4 when the word lines are asserted thus consumes substantially no power since the bit line voltages remain unchanged: bit line BL remains charged and the complement bit line BLB remains discharged. At time t4 to time t5, the port A word lines WLA0 and WLB0 are asserted to complete the write operation.

The read port A to each pseudo-triple-port bitcell as disclosed herein may also be denoted as a first read port. Similarly, the read port B to each pseudo-triple-port bitcell may also be denoted as a second read port. Referring again to column 100, the read port A bit line BL may also be denoted as a first read bit line. Similarly, the read port B bit line BLB may also be denoted as a second read bit line. Given this first and second read port terminology, it may thus be appreciated that each pseudo-triple-port bitcell may be deemed to have a first read port coupled to the first bit line, a second read port coupled to the second bit line, and a write port coupled to the first bit line and to the second bit line.

The global read bit line A may also be denoted as a first global read bit line. Similarly, the global read bit line B may also be denoted as a second global read bit line. The NAND1 logic gate may then be denoted as a first logic gate having an input coupled to the first bit line and having an output coupled to the first global read bit line. The NAND5 logic gate is another example of such a first logic gate. The NAND3 logic gate may also be denoted as a second logic gate having an input connected to the second bit line and having an output coupled to the second global bit line. The NAND6 logic gate is another example of the second logic gate.

Figure 6:
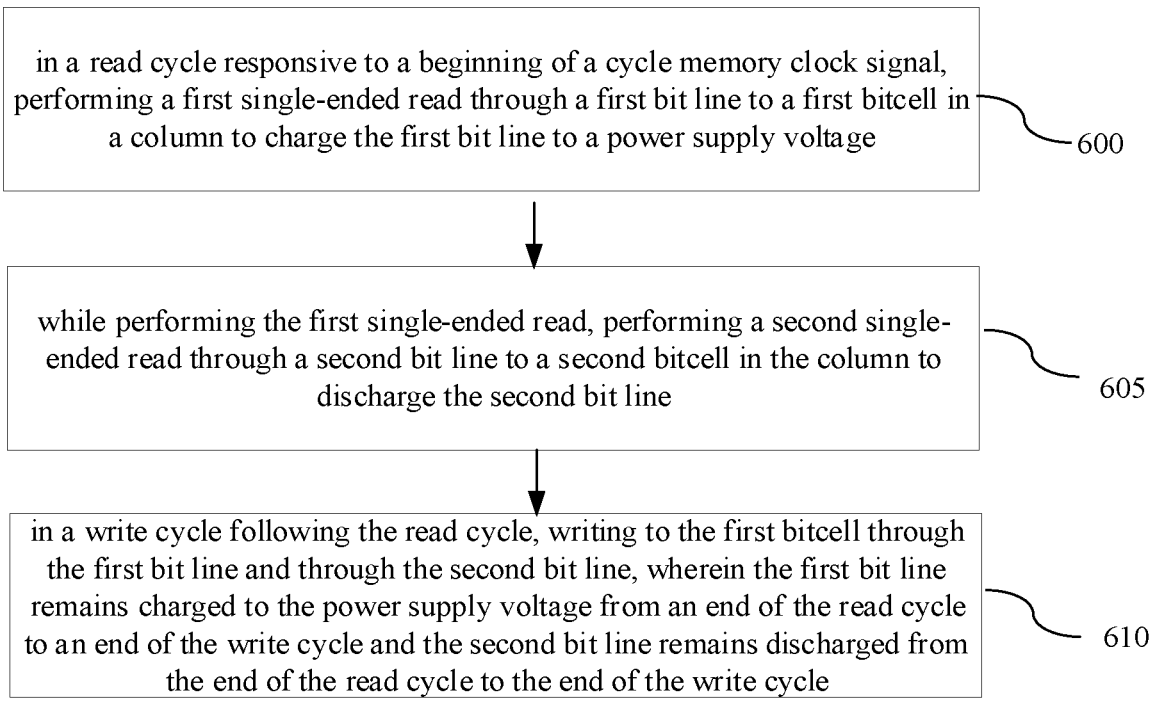
FIG. 6 is a flowchart for a method of operation of a pseudo-triple-port memory in accordance with an aspect of the disclosure.

Given this first bit line and second bit line terminology, a method for pseudo-triple-port memory will now be described with reference to the flowchart of FIG. 6. The method includes a read cycle that is responsive to a beginning of a cycle memory clock signal includes an act 600 of performing a first single-ended read through a first bit line to a first bitcell in a column to charge the first bit line to a power supply voltage. An example of such a first single-ended read is shown in FIG. 5B with regard to the charging of the bit line BL during the word line assertion from time t1 to time t2. The method also includes an act 605 that occurs during the first single-ended read and includes performing a second single-ended read through a second bit line to a second bitcell in the column to discharge the second bit line. An example of such a second single-ended read is shown in FIG. 5B with regard to the discharge of the complement bit line BLB from time t1 to time t2. Finally, the method includes an act 610 that occurs in a write cycle following the read cycle and includes writing to the first bitcell through the first bit line and through the second bit line, wherein the first bit line remains charged to the power supply voltage from an end of the read cycle to an end of the write cycle and the second bit line remains discharged from the end of the read cycle to the end of the write cycle. An example of such a write operation is shown in FIG. 5B in that bit line voltages for bit lines BL and BLB do not change from time t2 through to time t5.

Figure 7:
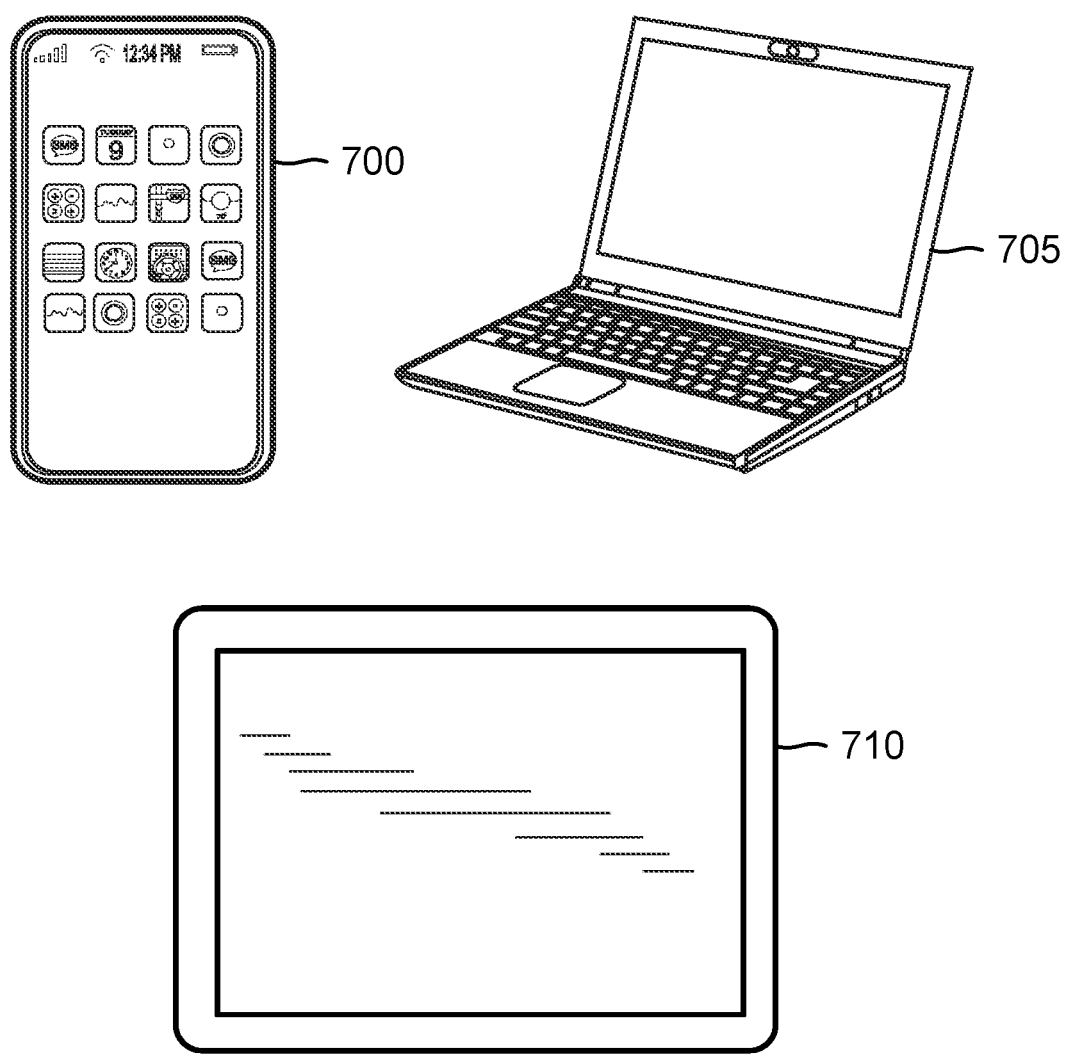
FIG. 7 illustrates some example electronic systems each incorporating a pseudo-triple-port memory in accordance with an aspect of the disclosure.

A pseudo-triple-port memory as disclosed herein may be incorporated into a wide variety of electronic systems. For example, as shown in FIG. 7, a cell phone 700, a laptop 705, and a tablet PC 710 may all include a pseudo-triple-port memory having datapaths in accordance with the disclosure. Other exemplary electronic systems such as a music player, a video player, a communication device, and a personal computer may also be configured with pseudo-triple-port memories having datapaths constructed in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A memory, comprising:
a first bit line for a first column;
a second bit line for the first column;
the first column including a plurality of first bitcells, each first bitcell having a first read port coupled to the first bit line, a second read port coupled to the second bit line, and a write port coupled to the first bit line and to the second bit line;
a first global read bit line;
a second global read bit line;
a first logic gate having a first input coupled to the first bit line and having an output coupled to the first global read bit line;
a second logic gate having a first input connected to the second bit line and having an output coupled to the second global bit line;
a power supply node for a power supply voltage; and
a first transistor coupled between a power node of the first logic gate and the power supply node, wherein the first transistor is configured to switch on in response to an assertion of a first address signal for the first column and the first global read bit line.

2. The memory of claim 1, wherein the first transistor is a PMOS transistor.

3. The memory of claim 2, further comprising:
a first NMOS transistor having a gate coupled to the output of the first logic gate and having a drain connected to the first global read bit line.

4. The memory of claim 3, further comprising:
a second NMOS transistor having a drain coupled to the output of the first logic gate and having a source coupled to ground, the second NMOS transistor being configured to switch on in response to a de-assertion of the first address signal for the first column and the first global read bit line.

5. The memory of claim 2, wherein the first column is a first upper column included in an upper bank, the upper bank further comprising:
a first bit line for a second upper column;
a second bit line for the second upper column;
the second upper column including a plurality of second bitcells, each second bitcell having a first read port coupled to the first bit line for the second upper column, a second read port coupled to the second bit line for the second upper column, and a write port coupled to the first bit line for the second upper column and to the second bit line for the second upper column; and
a third logic gate having a first input coupled to the first bit line for the second upper column and having an output coupled to the first global read bit line.

6. The memory of claim 5, further comprising a lower bank, the lower bank including:
a first bit line for a first lower column;
a second bit line for the first lower column;
the first lower column including a plurality of third bitcells, each third bitcell having a first read port coupled to the first bit line for the first lower column, a second read port coupled to the second bit line for the first lower column, and a write port coupled to the first bit line for the first lower column and to the second bit line for the first lower column;

the first logic gate further including a second input coupled to the first bit line for the first lower column, and the second logic gate further including a second input coupled to the second bit line for the first lower column.

7. The memory of claim 6, the lower bank further comprising:

a first bit line for a second lower column;

a second bit line for the second lower column;

the second lower column including a plurality of fourth bitcells, fourth bitcell having a first read port coupled to the first bit line for the second lower column, a second read port coupled to the second bit line for the second lower column, and a write port coupled to the first bit line for the second lower column and to the second bit line for the second lower column;

and a fourth logic gate having a first input coupled to the first bit line for the second upper column, a second input coupled to the first bit line for the second lower column; and the third logic gate further including a second input coupled to the first bit line for the second lower column.

8. The memory of claim 7, wherein the first logic gate is a first NAND gate, the second logic gate is a second NAND gate, the third logic gate is a third NAND gate, and the fourth logic gate is a fourth NAND gate.

9. The memory of claim 1, further comprising:

a second transistor coupled between a power node of the second logic gate and the power supply node, wherein the second transistor is configured to switch on in response to an assertion of a second address signal for the first column and the second global read bit line.

10. The memory of claim 9, wherein the second transistor is a PMOS transistor.

11. The memory of claim 1, further comprising a plurality of word line pairs corresponding to the plurality of first bitcells, each word line pair including a first read port word line and a second read port word line.

12. The memory of claim 11, wherein first bitcell includes a first access transistor coupled to the first bit line and a second access transistor coupled to the second bit line.

13. The memory of claim 1, further comprising:

a first sense amplifier having an input coupled to the first global read bit line; and a second sense amplifier having an input coupled to the second global read bit line.

14. The memory of claim 13, wherein the first sense amplifier is a first inverter and the second sense amplifier is a second inverter.

15. The memory of claim 1, wherein the first column is a first upper column included in an upper bank, the first bit line is a first bit line for the first upper column, and the second bit line is a second bit line for the first upper column, the memory further comprising a lower bank including:

a first bit line for a first lower column;

a second bit line for the first lower column;

the first lower column including a plurality of second bitcells, each second bitcell having a first read port coupled to the first bit line for the first lower column, a second read port coupled to the second bit line for the first lower column, and a write port coupled to the first bit line for the first lower column and to the second bit line for the first lower column; and wherein the first logic gate further includes a second input coupled to the first bit line for the first lower column, and the second logic gate further includes a second input coupled to the second bit line for the first lower column.

16. The memory of claim 15, wherein the first logic gate is a first NAND gate and the second logic gate is a second NAND gate.

17. The memory claim 16, further comprising:

a first NMOS transistor having a source coupled to ground, a drain coupled to first global read bit line, and a gate coupled to the output of the first NAND gate; and a first NMOS transistor having a source coupled to ground, a drain coupled to second global read bit line, and a gate coupled to the output of the second NAND gate.

* * * * *